United States Patent [19]

Zink

[11] Patent Number: 4,600,666

[45] Date of Patent: Jul. 15, 1986

[54] INTEGRATED PHOTOSCREEN FOR MAKING A HALFTONE REPRODUCTION PRINTING PLATE FROM A PHOTOGRAPH

[76] Inventor: Edmund S. Zink, 148 E. Harding, Des Plaines, Ill. 60016

[21] Appl. No.: 568,489

[22] Filed: Jan. 5, 1984

Related U.S. Application Data

[63] Continuation-in-part of Ser. No. 457,422, Jan. 12, 1983, abandoned.

[51] Int. Cl.⁴ .............................. G03F 9/00; G03F 5/00
[52] U.S. Cl. .......................................... 430/6; 430/396; 350/322; 355/125
[58] Field of Search ................... 430/6, 396; 350/322; 355/125

[56] References Cited

U.S. PATENT DOCUMENTS 3,912,510 10/1975 Marks ..................................... 430/31

FOREIGN PATENT DOCUMENTS 889107 2/1962 United Kingdom ..................... 430/6

OTHER PUBLICATIONS

Southworth, "How to Make a Halftone Negative", Reproductions Review, vol. 16, No. 5, May 1966, p. 28.

Primary Examiner—John E. Kittle
Assistant Examiner—José G. Dees
Attorney, Agent, or Firm—Thomas R. Vigil

[57] ABSTRACT

The photoscreen for making a halftone reproduction from a photograph is used in a process where the photograph is placed in a reproducing position relative to a reproducing apparatus and the screen is interposed between the photograph and the reproducing means of the reproducing apparatus so that upon operation of the reproducing apparatus, a halftone reproduction is created. The photoscreen comprises a sheet of transparent material having on the bottom surface thereof an array of light modulating, varying density, light gray, vignetting dots mixed with an array of light modulating white dots preferably printed on the top surface thereof.

40 Claims, 13 Drawing Figures

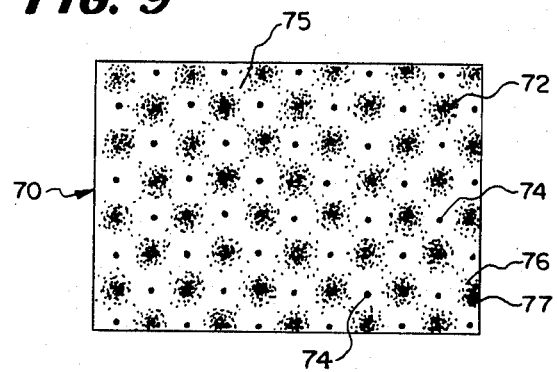
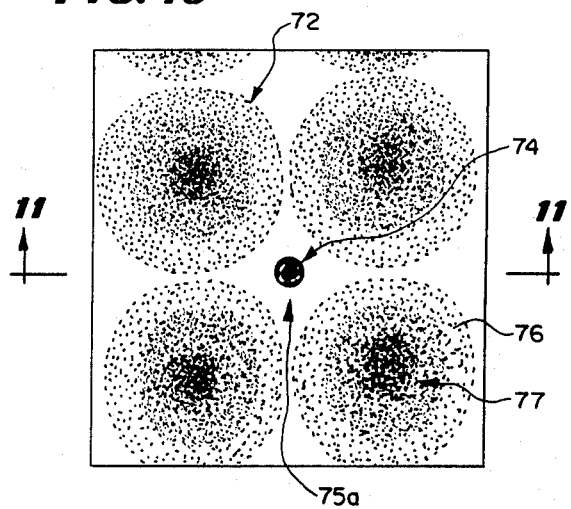
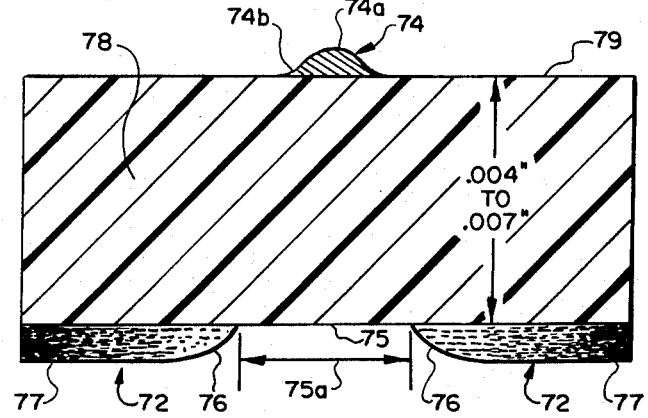

INTEGRATED PHOTOSCREEN FOR MAKING A HALFTONE REPRODUCTION PRINTING PLATE FROM A PHOTOGRAPH

This application is a continuation-in-part of U.S. application Ser. No. 457,422 filed on Jan. 12, 1983, abandoned.

BACKGROUND OF THE INVENTION

1. Field of the Invention

The present invention relates to an integrated photoscreen for making halftone reproductions from photographs, and a method for using the photoscreen to make such halftone reproductions, suitable for offset printing.

2. Description of the Prior Art

Heretofore much difficulty has been encountered in making a printing plate from a photograph utilizing conventional electrostatic platemakers. The difficulty has been primarily in the reproduction of gradations in color or lightness and darkness. In this respect, without using some sort of screen technique, the white areas or tones and the black areas or tones will come out on the plate with continuous white or dark areas rather than with a gradation of white or dark areas.

One previously proposed solution to the problem of creating a halftone printing plate was to create a printable dot contact screen sold under the trademark KODAK PMT by the Eastman Kodak Company. With the PMT TM screen, good reproduction is obtained with the halftones custom made to the capability of the printing press. In other words, the tone range, from highlight to shadow, of most original pictures is usually greater than the printing press is capable of printing. According to the KODAK TM system, good reproductions are made by measuring the press's capability to record or print highlight and shadow dots and then, working back from the press capability, to determine dot sizes required in the halftone to be created for the camera. The cameras utilized in electrostatic platemaking are manufactured by a number of companies, such as, for example, the 3M Company which manufactures the 2M 1165 Automatic Exposure Platemaker, the A. B. Dick Company which manufactures the A. B. Dick 145 Photomat TM Platemaker and the A. B. Dick 155 Electrostatic Master Maker, and by Madax Graphics Products, Incorporated, which makes the Madax VFV 215 Variable Focus Verilith System.

With the Kodak TM PMT system, a number of steps are required to produce good quality photoreproduction by electrostatic cameras. First a Kodak reflection density guide Q-16 is mounted on the copy board as you would mount a piece of copy.

Second, a sheet of Kodak PMT negative paper AD is placed on the camera back and covered with a Kodak PMT gray contact screen. This is then exposed using a main exposure only.

Third, the screened image is transferred to the Kodak PMT receiver paper in a special diffusion-transfer processor containing Kodak PMT activator.

Fourth, the resulting screen print should have just enough exposure to burn out the first two steps on the Kodak reflection density guide and to pick up dots in the third step. The 2.00 step in the Kodak reflection density guide should be completely black at this point.

In the fifth step, the screened print is mounted on the copy board and exposed at the same size to a sheet of Kodak PMT paper plate negative material using normal exposure.

In the sixth step, the PMT negative is processed with a Kodak PMT printing plate in a diffusion-transfer processor containing Kodak PMT activator.

Now the operator, after taking care of the makeready, is ready to run a press sheet from the plate on the stock the operator will be using for the printing job.

Next, in the eigth step, the operator examines the press sheet and picks out the smallest printable dot from any density step and the largest printable dot from any density step and records the density steps producing these dots.

Finally, the original screen print is compared to the printed sheet to find the step on the screen print in which the smallest printable dot appeared on the printed sheet. The dot appearing in that step on the original screen print should then become the operator's "aim highlight" dot for all screen prints made using the PMT product.

Also from a comparison of the original screen print to the printed sheet, the operator will find the step on the screen print in which the largest printable dot appeared on the printed sheet and the dot appearing in this step on the screen print then becomes the "aim shadow" dot for all the screen prints made using the PMT product for that printing job.

As will be described in greater detail hereinafter, the integrated photoscreen of the present invention provides a simple means for making a good quality halftone printed reproduction on a printing plate of a photograph without the lengthy and cumbersome process of creating a specialized PMT TM product.

Also heretofore a number of proposals have been made for improving the making of a halftone reproduction, some of which proposals include the manufacture and use of a film mask. Examples of previously proposed systems utilizing film masks and/or describing various forms of film masks are disclosed in the following U.S. patents:

| U.S. Pat. No. | PATENTEE |
| --- | --- |
| 3,152,528 | Pendry |
| 3,905,822 | Marks |
| 3,192,510 | Marks |
| 3,961,847 | Pendry |
| 4,003,649 | Goren et al |
| 4,012,137 | Goren |
| 4,027,962 | Mailloux |
| 4,080,055 | Gary |
| 4,083,632 | Mailloux et al |
| 4,090,786 | Bobbe |
| 4,143,967 | Wicker |
| 4,227,795 | Bobbe et al |

With reference to the above noted patents and other patents various techniques have been proposed for improving the making of a halftone reproduction using a Xerographic or Electrostatic Process.

Large solid area development was the primary problem associated with Xerography, but the Xerographic and the Electrostatic processes were producing excellent results with text type and simple line art drawings. The idea to produce an electrostatic offset printing plate was a tremendous advance in producing good quality printing of type and line art drawing. The reproduction of a continuous tone picture or transparency with Xerographic or Electrostatic process, which is a very high contract process, cannot distinguish the varying densities of a continuous tone original document accurately. Large areas of solid image was the primary problem of Xerography.

One solution to the problem of the large solid areas of the Xerographic photoreceptor has been the adoption of development techniques other than the open cascade development system which alters the charge pattern present on large areas of contiguous charge on the photoreceptor. Many other techniques are well known, such as a magnetic brush, powder cloud or liquid development system, or by the use of development electrodes, for example, as disclosed in the Gundlack U.S. Pat. No. 2,777,418 or the Clark et al U.S. Pat. No. 2,952,241.

Other techniques include breaking up the contiguous charge on the photoreceptor by the use of mechanical, optical or electrocal techniques. For example, the Carlson U.S. Pat. No. 2,599,542 suggests using an electrophotographic plate which has been etched to resemble a waffle (grid design) and the Weigl U.S. Pat. No. 3,248,216 teaches discharging the electrostatic plate selectively to produce a pattern to break up a solid area.

Optical techniques for improving solid area coverage have been employed to discharge the solid area using a screened light source. The screen may consist of or take the form of a line or comb screen or a grid or dot pattern. The electrostatic plate is selectively discharged in those areas where light passes through the screen but retains its charge in those areas blocked by the opaque areas in the screen. Examples of optical techniques for improving solid area coverage may be found in U.S. Pat. Nos. 2,598,732; 3,121,010; 3,212,888; 3,335,003; and 3,535,036. These previously proposed techniques were, in effect, related to the Xerographic copying system and not particularly related to the art of producing a halftone reproduction of a continuous tone original document by a screen technique.

In the Pendry U.S. Pat. No. 3,152,528 there is disclosed a shadow-casing member comprising an array of opaque lines or opaque dot elements which break up the light into a halftone pattern. The resulting electrostatic images, after exposure, are subdivided into a halftone pattern, resulting in a configuration of the electrostatic fields above the photoconductive surface which causes the uniform halftone development of large solid areas and the rendering of continuous tones as halftones.

Accordingly, this patent teaches the use of a screen consisting of alternating opaque and transparent areas superimposed over a document to be copied between the document and the lens system of a Xeroxgraphic copy machine. This technique did improve the solid areas of the Xerographic process in producing an inaccurate copy of a continuous tone original.

Another approach has been the use of compound document screens as described in the Marks U.S. Pat. Nos. 3,905,822 and 3,912,510. More specifically, Marks teaches the use of a compound screen to extend the range of input densities transmitted or reflected from an original document over which there is a change of output density in a copy made using a high contrast electrophotographic process such as Xerography.

An object of the Marks technique is to extend the range of the Xerographic process by employing a compound document screen, consisting of a clear transparent substrate material, having on at least one surface thereof, a plurality of substantially opaque dots of uniform density, which screen is adapted to be positioned proximate to, preferably in contact with, the face of the document to be copied, between the document face and a lens system of an electrophotographic copying system. The dots in this screen consist of a plurality of substantially light-absorbing dots and a plurality of substantially light-reflecting dots.

The frequency and array of these dots is such that light which is reflected by the screen is modulated by the lens in accordance with the modulation transfer function of the lens system employed in a Xerographic copier.

Thus, the halftone screen consisted of a plurality of mixed, substantially opaque dots of uniform density, half of which are substantially equal light-absorbing dots and half of which are substantially equal light-reflecting dots. The substantially light-absorbing dots, referred to as black dots, should be of such density to absorb at least eighty percent of the light. Also, the light-reflecting dots, referred to as white dots, should reflect at least eighty percent of the light and optimum results are achieved as both values approach one hundred percent.

However, it is the lens system which modulates the light transmitted or reflected from the original document in accordance with the Modulation Transfer Function (MTF) of the particular lens system that is employed in an electrostatic copying machine. For a given lens system MTF, the frequency of the dot pattern is too low if the dot pattern is accurately imaged by a properly focused lens. In this case, the aerial image of the dot pattern would be a square wave which according to conventional Fourier Analysis, comprises sine waves at the fundamental dot pattern frequency and many higher harmonics. Such a square wave aerial image produces a single dot size on the photosensitive member.

The lens system employed in common Xerographic equipment, exhibits a rather large MTF as compared to the present high quality lens systems employed in electrostatic offset plate-making machines. As a result, the screen disclosed in the Marks patent will not give the desired result in halftone reproduction on a printing plate for continuous tone originals using electrostatic offset plate making machines. In this respect, the compound screen exhibits only substantially uniform dot sizes which will not change in size due to the effect of image transmittance or reflectance through the compound screen.

In contradistinction, the integrated photoscreen of the present invention produces varying amounts of light reflected or transmitted by the use of varying density, vignetting dots, which vary in density from a lightest density on the outside perimeters of the dots to the darkest core in the extreme center of the dot and by the use of light modulating white dots which, in effect, are modulated through the transparent substrate from the surface of the original document's continuous tones.

The integrated photoscreen of the present invention modulates the light reflected or transmitted by varying the density of the original document's continuous tone, or to reduce or decrease the density range of the original document's continuous tone to make a halftone reproduction which is suitable for the offset printing process and which is used as an electrostatic printing plate.

None of the prior art patents referred to above, disclose or suggest a film mask for reducing or decreasing the original document's continuous tone density range with such a film mask having an array of varying density, light modulating, vignetting, light gray dots, mixed with an array of light modulating white dots on a sheet of transparent film material.

In the Turner et al U.S. Pat. No. 3,961,847 there is disclosed an electrophotographic printing machine having an arcuate photoconductive member. An arcuate screen member is mounted in the printing machine and is closely spaced to the photoconductive member so as to produce half tone images of an original document. The screen member itself includes a plurality of lines or dots printed on a substantially transparent sheet.

In the Goren et al U.S. Pat. No. 4,003,649 there is disclosed a phase screen having a substrate made of a non-absorbing transparent material such as glass or plastic. A plurality of square cut rulings or grooves of a predetermined screen frequency extend in straight lines across the substrate. The phase screen is positioned above the surface such that the rulings are aligned parallel to the direction of rotation and orthogonal to the axis of the drum.

In the Goren et al U.S. Pat. No. 4,012,137 there is disclosed a screen member that continuously rotates and comprises a square array of dots thereon. Single color light images, namely, red, blue and green, pass through the screen member and irradiate a charged photoconductive member which dissipates the charge thereon to produce single color electrostatic latent images thereon.

In the Mailloux U.S. Pat. No. 3,027,962 there is disclosed an electrographic printing machine having a dot screen and a transparent platen with an opaque sheet interposed therebetween. A color filtered light image of a color transparency is formed on the platen whereby the dot screen modulates the color transparency image forming a half tone light image which is combined with the image of a composition frame forming a combined image. In this manner, a combined image is formed on the transparent platen, thus enabling a scanning system to form a flowing half tone light image thereof, and as such, a combined flowing light image which passes through the dot screen and composition frame.

In the Gary U.S. Pat. No. 4,080,055 there is disclosed a screen member including a transparent disc having a plurality of dots disposed thereon. The screen is positioned at discrete preselected angles through which successive color filtered light images pass. An unfiltered light image is transmitted through the screen with the screen being positioned at one of the preselected angles for the filtered light image.

In the Mailloux et al U.S. Pat. No. 4,038,632 there is disclosed a half-tone screen including a clear transparent substrate having a plurality of spaced opaque regions thereon. The opaque regions are arranged in at least a high frequency repetitive pattern and a low frequency repetitive pattern. The screen can be used to modulate the light image of a color transparency being reproduced by an electrophotographic printing machine.

In the Bobbe U.S. Pat. No. 4,090,786 there is disclosed a screen member including a transparent sheet having a plurality of hard dots thereon. A plurality of sets of dots are disposed on the transparent sheet wherein each set acts as a light filter permitting light rays having a discrete spectal band width to pass therethrough. Each set of light filtering regions is substantially complementary in color to the color of the filtered light image, and rotated through a pre-selected angle relative to the next adjacent set of light filtering regions.

In the Wicker U.S. Pat. No. 4,143,967 there is disclosed a dark screen having small openings which have been aligned at a specific angle in relationship to a screen member. The screen has two punched holes which represent the axis of the screen and which are used to register the screen with a film positioned beneath a halftone. As such, this patent discloses a method of producing a latent photograph by using a reproduction of the photograph in both negative and positive form, and photographing both negative and positive in sequence and in register through the dark screen.

In the Bobbe et al U.S. Pat. No. 4,227,796 there is disclosed an optical system in which a movable photosensitive member is exposed to a light image of an original document, including a light source which illuminates a screen having at least two adjacent rows of opaque dots. The screen is disposed in an opaque frame or slit and has a plurality of dots disposed thereon arranged in successive rows. In this manner, a finely divided charge pattern is recorded on the photosensitive member.

None of the prior art patents referred to above disclose or suggest a film mask to reduce or decrease an original document's (photograph's) continuous tone density range with a film mask having an array of varying density, light modulating, vignetting, light gray dots mixed with an array of light modulating white dots on a sheet of transparent film material as provided by the integrated photoscreen of the present invention as will be described in greater detail in the following description.

SUMMARY OF THE INVENTION

According to the invention there is provided a method for making a document, such as a photograph, having continuous tone areas halftone reproduction from a photograph according to the following steps: placing the document in a reproducing position relative to a reproducing apparatus; interposing between the document and reproducing means of the reproducing apparatus a transparent photoscreen comprising a sheet of transparent substrate material hving an array of varying density, light modulating, light gray vignetting dots, which vary in density from a lighest density outer area to a darkest core density in the extreme center of the dot formed on one side of the sheet, mixed with an array of light modulating white dots formed on the other side of the sheet, said light modulating gray vignetting dots and said light modulating white dots serving to modulate light through the transparent substrate from the photograph's continuous tone; and operating the reproducing apparatus to create a halftone reproduction of the document wih said photoscreen serving to reduce the original document's continuous tone density range.

Further according to the invention there is provided a photoscreen for making a halftone reproduction from a document, such as a photograph, having continuous tone areas in a process where a document is placed in a reproducing position relative to a reproducing apparatus and said photoscreen is interposed between the document and reproducing means of the reproducing apparatus so that upon operation of the reproducing apparatus a halftone reproduction is created. The photoscreen is comprised of a sheet of transparent substrate material having an array of light modulating, varying density, light gray, vignetting dots formed on one side thereof, which vary in density from a lightest density outer area on the outside perimeter of the dot to a darkest core density in the extreme center of the dot, mixed with an array of light modulating white dots formed on the other side of said sheet of substrate material. The integrated photoscreen modulates the light, reflected or transmitted, by varying the density of the original photograph's continuous tone, or to reduce or decrease the density range of the original photograph's continuous tone to make a halftone reproduction which is suitable for the offset printing process and which is used on an electrostatic printing plate.

BRIEF DESCRIPTION OF THE DRAWINGS

FIG. 9 is a greatly enlarged/magnified view of the photoscreen of the present invention showing light modulating, varying density, light gray vignetting dots and with light modulating white dots shown as small black dots.

FIG. 10 is an even greater magnification of the photoscreen shown in FIG. 9.

FIG. 11 is a greatly enlarged cross section of a piece of the photoscreen of the invention and is taken along line 11—11 of FIG. 10.

DESCRIPTION OF THE PREFERRED EMBODIMENT

Figure 1:
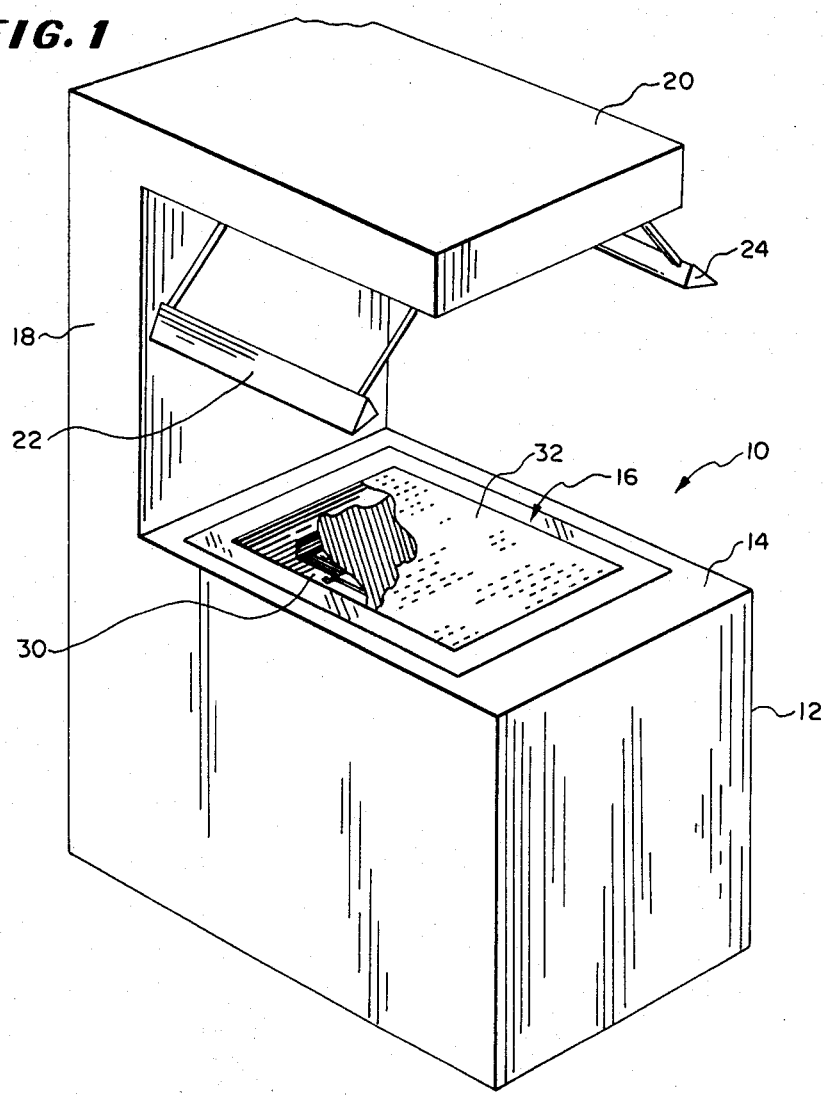
FIG. 1 is a perspective view of an electrostatic platemaking camera apparatus.

Referring now to the drawings in greater detail, there is illustrated in FIG. 1 an electrostatic platemaking camera apparatus which is generally identified by the reference numeral 10. This apparatus 10 can be of the type sold by the A. B. Dick Company under their trademark A. B. Dick 145 Photomat Platemaker or A. B. Dick 155 Electrostatic Mastermaker.

Such electrostatic platemaking camera apparatus 10 includes a cabinet 12 having an upper table forming surface 14 on which there is positioned an image receiving area 16.

Extending upwardly from the backside of the cabinet 12 is a frame portion 18 and extending forwardly from the frame portion 18 is a lens mounting overhead structure 20. Depending from the overhead structure 20 are lamps 22 and 24 positioned to illuminate the image receiving surface 16 on the table surface 14.

Positioned on and within the image receiving surface 16 is a photograph 30 and in accordance with the teachings of the present invention, an electrostatic integrated photoscreen 32 made in accordance with the teachings of the present invention is positioned over the photograph 30.

Figure 2:
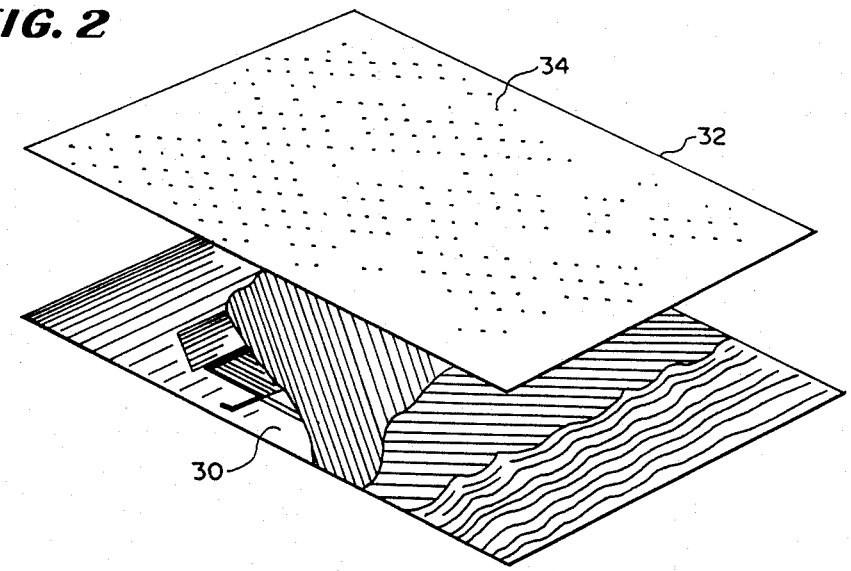
FIG. 2 is a perspective view of the photograph that is positioned in the reproducing position on the camera shown in FIG. 1 with a photoscreen made according to the teachings of the present invention positioned thereabove ready to be placed on the photograph.

In FIG. 2 is shown an enlarged perspective view of the photograph 30 with an enlarged perspective view of the photoscreen 32 positioned above the photograph 30. The photoscreen 32 is made of a transparent film material such as acetate or mylar. In one preferred embodiment, the photoscreen 32 is made of 0.004 or 0.007 inch transparent mylar film.

According to the teachings of the present invention, the photoscreen 32 has an array of light modulating, vignetting, light gray dots thereon together with an array of light modulating white solid dots mixed in or superimposed on the light gray vignetting dots. The vignetting dots are generally identified by reference numeral 34 in FIG. 2 and each dot 34 varies in density from a lightest area 76 (FIGS. 9-11) on the outside perimeter of the dot 77 to a darkest core area 36 (FIGS. 9-11) in the extreme center of the dot 34 as shown in FIGS. 9 through 11 for dots 72.

Figure 3:
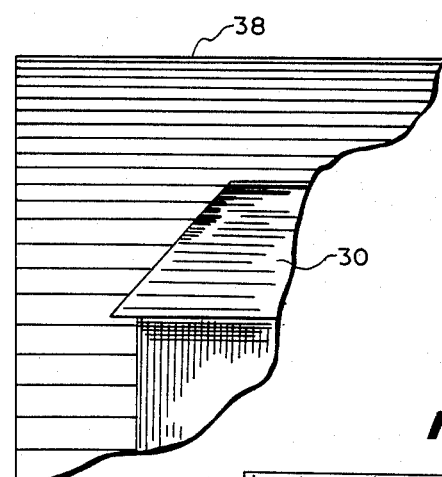
FIG. 3 is a plan view of a corner of a picture such as found on a photograph.

Turning now to FIG. 3, there is illustrated therein an artist's simulation of top left hand corner 38 of the photograph 30 showing the corner of a building.

Figure 4:
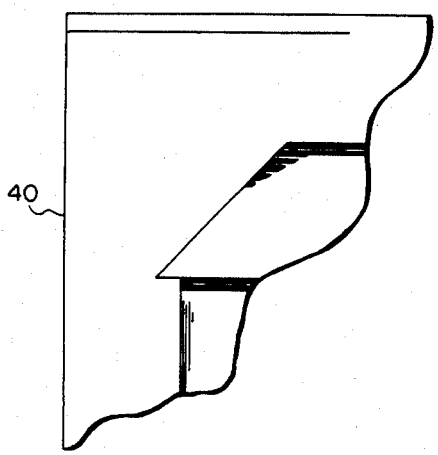
FIG. 4 is a plan view of a reproduction of the corner shown in FIG. 3 made with an electrostatic platemaking camera apparatus.

FIG. 4 is the artist's simulation of a reproduction 40 of the corner 38 shown in FIG. 3 using the platemaking camera apparatus 10 without the use of a photoscreen or mask over the photograph 30. The contrast is ultra-high, dark shadows printing as black and light shadows printing as white with few midtones.

Figure 5:
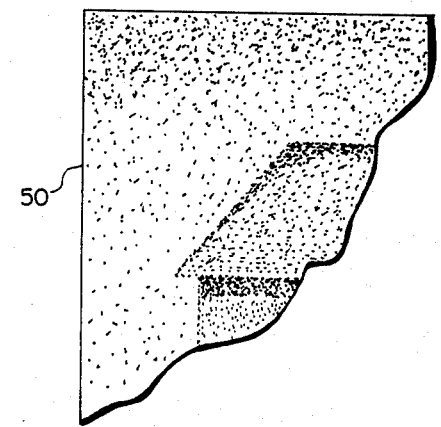
FIG. 5 is a plan view of the corner of the picture shown in FIG. 3 made using the photoscreen of the present invention.

FIG. 5 is an artist's simulation of a reproduction 50 of the corner 38 of the photograph 30 shown in FIG. 3 made with the platemaking camera apparatus 10 utilizing the photoscreen 32 of the present invention superimposed over the photograph 30 when the reproduction 50 is created. Here the dark areas are lightened and the light areas are darkened and the gray areas therebetween are shown more precisely.

Figure 6:
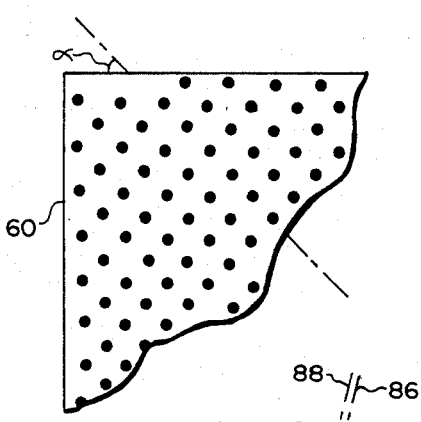
FIG. 6 is an enlarged corner view of a screen or mask having vignetting dots thereon at line angles of 45°.

FIG. 6 is an enlarged view of the corner of a photoscreen 60 having an array of light modulating, varying density, light gray vignetting dots 62 which are photographically created on the photoscreen 60 at an angle of 45°. In this respect, it will be seen that the vignetting dots 62 appear as lines forming an angle with the horizontal of approximately 45°.

Figure 7:
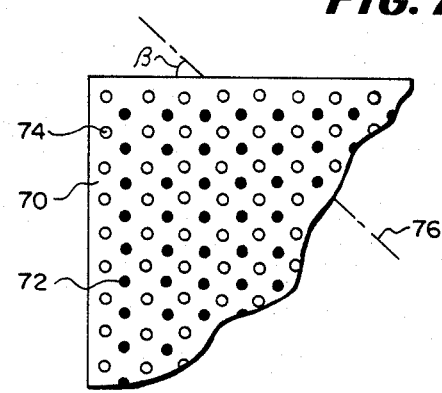
FIG. 7 is an enlarged corner view of a screen or mask having vignetting dots thereon at line angles of 45° and an array of white dots mixed in or situated between the vignetting dots and having line angles of approximately 45°.

In accordance with the teachings of the present invention an array of light modulating white dots is superimposed over the vignetting dots. Such an array of dots is illustrated in FIG. 7. Here a photoscreen 70 is shown having an array of vignetting dots 72 photographically created on the photoscreen 70 at an angle of approximately 45°. Then, superimposed on the photoscreen 70 is a plurality of light modulating white dots 74 which are printed on the screen 70 at line angles of approximately 45° also. In this embodiment of the photoscreen 70, the white dots 74 are arranged in line with the vignetting dots 72 so that such dots 74 and 72 are in line with each other such as in line 76 as shown in FIG. 7.

The vignetting dots 72 can be created on the photoscreen 70 using a so-called Levy glass screen having 60 to 160 lines per inch to create vignetting dots having a dot density of 60 to 160 rows of dots per inch.

The light modulating white dots 74 are applied on the photoscreen 70 on the opposite side of the light gray vignetting dots 72 as shown in FIG. 9. The application of the white dots 74 is by transferring an ink film to the transparent substrate by a printing process. The same Levy glass screen having 40 to 160 lines per inch is used in the printing of the printed white dots.

In FIGS. 9–10 is shown a greatly enlarged/magnified bottom surface 75 of the photoscreen 70 showing varying density light gray vignetting dots 72 and the white dots 74 which, for the sake of clarity, are shown as small black dots. Here it will be seen that the outer perimeter 76 of each vignetting dot 72 is very light gray and that the dot 72 darkens inwardly toward the center 77 of the dot which is the darkest gray part of the dot.

The above described construction is also shown in greatly magnified cross section in FIG. 11. Here the transparent film substrate 78 can be 0.004 to 0.007 inch thick with white dots 74 printed on the top surface 79 of the photoscreen 70 and with the vignetting dots 72 on the bottom surface 75. The center 74a of the white dot 74 is the thickest part of the dot 74 and the edge 74b is thinner, tapering to the top surface 79. This is caused by the molecular attraction of the material and such thinner edge 74b modulates the light passing through the photoscreen. As shown, the white dots 74 are printed on the top surface 79 above a clear area 75a on the bottom surface 75 between the vignetting dots 72.

Best results are obtained when the bottom surface 75 is placed against the photograph and the upper surface 79 faces the photoreceptor. Then as light passes through the photoscreen 79 and to an original continuous tone document or photograph, light is reflected back through the screen from the surface of the original document. The reflected light is modulated in an orderly fashion by the action of the photoscreen's ability to modulate the light and to decrease or reduce the original document's density range and reflect a dot pattern to the photoreceptor in accordance with size of the modulating dot or transmitted by the photoscreen.

A preferred dot density for both the vignetting dots 72 and the white dots 74 are approximately 85 dots per inch.

The optical density to the photoscreen 70 of the vignetting dots 72 and the white dots 74 can range from 5% to 40%. By this it is meant that the size of the dots will be 5% to 40% of the total space on the photoscreen. 0% would be no dots at all, i.e., a clear, transparent photoscreen 70 while 100% density would mean that the photoscreen 70 was completely covered with dots.

A preferred vignetting dot size range is 25–30%. Again, this means that each vignetting dot will occupy 25–30% of the total space available on the photoscreen 70. A preferred white dot size is 25% of the total photoscreen space and the preferred vignetting dot size is 25% of the total photoscreen space.

Figure 8:
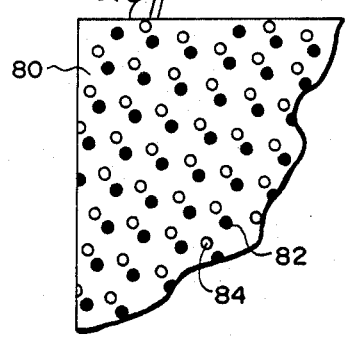
FIG. 8 is a corner plan view of a photoscreen made according to the teachings of the invention with the array of white dots situated between or mixed with an array of vignetting dots with both the white and the vignetting dots being arranged at line angles of approximately 105°.

Although a preferred dot line angle is 45° as shown in FIG. 7, another line angle that can be used in 105°. Such a dot line angle is shown in FIG. 8 where a corner of a photoscreen 80 is shown with lines of vignetting dots 82 at an angle of 105° and with lines of white dots 84 positioned adjacent the lines of vignetting dots 82 and also at line angles of 105°. One line of vignetting dots 82 is identified by the reference numeral 86 and an adjacent line of white dots 84 is identified by the reference numeral 88.

Although dot line angles of 45° and 105° are shown in FIGS. 7 and 8, it is to be understood that the vignetting dots 72 or 82 can have a line orientation of anywhere from 0° to 180°. Likewise the white dots 74 or 84 can have a line angle of anywhere from 0° to 180°.

In another embodiment (not shown) the vignetting dots were created with line angles of 45° while the white dots were created with line angles of 105°. Thus, the white dots can have a different line angle or orientation than the vignetting dots whereby some of the white dots are printed partially over vignetting dots.

In addition to having different line angle orientation the white dots can be superimposed or printed on the array of vignetting dots in a random manner or in a predetermined relationship to the vignetting dots. In this respect, as shown in FIG. 7, the white dots 74 are arranged in line with and interspersed in between the vignetting dots 72. On the other hand, each white dot 84 shown in FIG. 8 is positioned at the upper left hand corner of a vignetting dot 82. Also and as noted above, the white dots can have a different line angle and the array can be superimposed on the array of vignetting dots.

Empirical tests with electrostatic platemaking camera apparatus have produced very good quality reproductions with half-tones which provide a good reproduction of the light gray and dark gray areas in between solid white and solid dark areas. Although not all of the different line angle arrangements and different positioning of the white solid dot array over the black vignetting dot array have been tested, those that have been tested provide good halftone reproduction. Accordingly, any photoscreen having vignetting dots and white dots as taught by the present invention should produce improved halftone reproductions.

Figure 12:
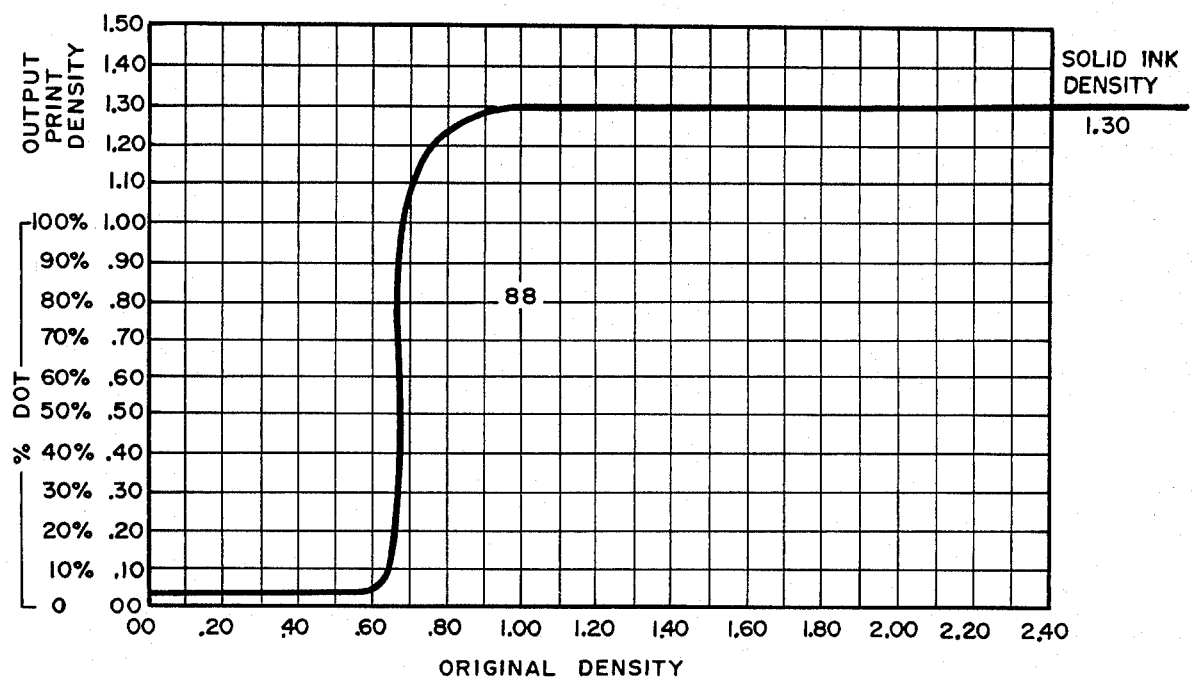
FIG. 12 is a graph of output print density versus the original document or photograph color density without using the photoscreen of the present invention.

In FIG. 12 is shown a graph 88 of output density versus original density of a document where print on a plate was made without using a photoscreen. Here it will be seen that the lighter areas (below 0.50 density) are printed light and the darker areas (above 0.80 density) are printed dark, where and where density=Logic 1/R, with R being reflectance or transmittance.

Figure 13:
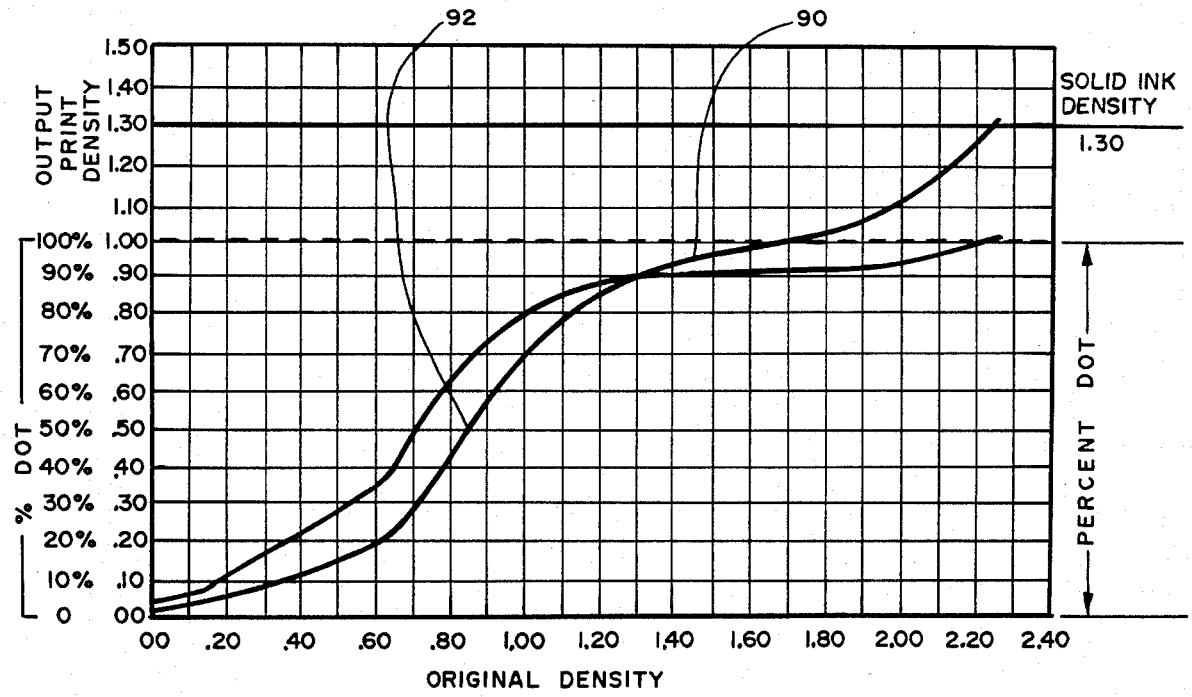
FIG. 13 is a graph of output print density versus the original document or photograph color density using the photoscreen of the present invention and a graph of the percent of dots printed versus density of dots.

FIG. 13 is a graph 90 of output print density vs original document density for a printing or plate made using the photoscreen 70 or 80 of the present invention. The graph 90 shows that a much better printing of the varying tones on the original document has been achieved using the photoscreen 70 or 80 as evidenced by the gradual increasing of halftone between 0.10 and 0.65 density. From 0.65 density and the 1.20 density, the increase is at a steep slope but still providing gradation in halftone reproduction. Then from 1.20 density to 2.10 density the increase is again more gradual.

Also shown in FIG. 13 is a graph 92 of percent of printing of dots printed on a piece of paper using the halftone printing plate made using the photoscreen of the present invention vs original document density.

The improved halftone reproduction results shown in FIG. 13 are obtained by using the integrated photoscreen 70 or 80 of the present invention. Such photoscreen 70 or 80 is constructed of a clear transparent substrate material having on at least one surface thereof a plurality of varying density, light modulating vignetting, light gray dots which are in effect dots which vary in density from the outermost fringe to the central core. The photoscreen 70 or 80 also has one surface primarily constructed with a plurality of light modulating white dots which are in effect, dots which modulate the light reflected or transmitted. Both dots represent a decrease or reduction of the original document's continuous tone density range. The photoscreen's density range in combination with or added to the original document's density range, represents an ideal range to modulate the light which is then transmitted or reflected through a superior lens system and projected on the surface of a photosensitive member of an electrostatic offset platemaking camera. The projected light dissipates the electrostatic charge on the photosensitive member from the pattern of modulated light from the action of the photoscreen's integration of the original document's continuous tones and the varying density light modulating vignetting light gray and white dots.

The dissipated pattern represents a negative image of the original which in reality now is called a halftone reproduction. The halftone is found to consist of a plurality of dots which vary in size from the smallest dot to a larger dot which overlaps adjacent dots. This effect creates an optical effect of continuous tones by varying the dot sizes accordingly to the dissipated charge. This latent halftone negative image on the photoconductive layer is then developed by contacting it with a finely divided electrostatically attractable material, such as a resinous colored powder or liquid called a toner. The areas of the image which have been dissipated do not attract or receive the toner powder or liquid. It is the opposite or non-dissipated areas which receive the toner or liquid which is now a positive image. The toner is held to the image areas by electrostatic charge fields on the layer. The toner is held proportionately to the charge field so that the greatest amount of material is deposited where the greatest charge field is located. Where there is a minimum charge, there is little or no material deposited. Where there is a minimum charge, there is little or no material deposited. Therefore, a toner image is produced to conform with the opposite of the latent halftone negative image previously placed on the photoreceptor.

It is this relationship between a latent halftone negative image and the toner deposited image that produces the halftone positive in which an offset printing plate can be produced.

In electrostatic platemaking systems, the toner is applied to the support surface of the printing plate and is suitably fixed thereto to form a permanent image. This fixing may take place by heat or vapor, which fuses the toner to the support material to which it has been applied. It is this image that is now on the electrostatic offset printing place that now represents a positive halftone image of the original document's continuous tones. The continuous tones of the original document now are halftone dots which vary in size from very small black dots to very large overlapping black dots. The minute changes in density of the original document are conveyed as minute changes in dot size on the electrostatic offset printing plate.

Thus, it is this process which conveys the impression of accurate reproduction of density gradients of the original document and to which a halftone reproduction can be printed from an electrostatic offset printing plate made with the integrated photoscreen without using a prehalftone screened original document.

The photoscreen is most useful in making a printing plate from a photograph in an electrostatic platemaking device but also can be used in other electrostatic devices such as copying machines.

From the foregoing description it will be apparent that the photoscreen of the present invention provides a distinct advantage over the more complicated prior art techniques for making halftone printing plates and reproductions therefrom with an electrostatic platemaking camera apparatus. Also, the photoscreen of the present invention can be used with office copying machines and with an offset camera to provide a halftone film positive or negative or a halftone photograph produced therefrom.

Also it will be apparent that various modifications can be made to the photoscreen of the present invention without departing from the teachings of the present invention. Accordingly, the scope of the invention is only to be limited as necessitated by the accompanying claims.

I claim:

1. A method for making a halftone reproduction from a document, such as a photograph, having continuous tone areas, comprising the steps of: placing a document in a reproducing position relative to a reproducing apparatus; interposing between the document and reproducing means of the reproducing apparatus a transparent photoscreen comprising a sheet of transparent substrate material having an array of varying density, light modulating, light gray, vignetting dots which vary in density from a lightest density outer area to a darkest core density in the extreme center of the dot formed on one side of the sheet mixed with an array of light modulating white dots formed on the other side of the sheet and operating the reproducing apparatus to create a halftone reproduction of the document or photograph with said photoscreen serving to reduce the original document's continous tone density range.

2. The method of claim 1 wherein said photoscreen is placed on the document or photograph.

3. The method of claim 1 wherein said reproducing apparatus is an electrostatic platemaker.

4. The method of claim 1 wherein said reproducing apparatus is a copying machine.

5. The method of claim 1 wherein said reproducing apparatus is an offset camera and said halftone reproduction is a halftone film negative used to produce a positive or negative halftone image on an offset plate.

6. The method of claim 1 wherein said dots occupy 1% to 40% of the photoscreen space.

7. The method of claim 1 wherein said vignetting dots occupy 1% to 40% of the total photoscreen.

8. The method of claim 7 wherein said vignetting dots occupy 25% to 30% of the total photoscreen.

9. The method of claim 7 wherein said vignetting dots occupy 25% of the total photoscreen space.

10. The method of claim 1 wherein said white dots occupy 1% to 40% of the total photoscreen space.

11. The method of claim 10 wherein said white dots occupy 25% to 30% of the total photoscreen space.

12. The method of claim 10 wherein said white dots occupy 25% of the dot position spaces per line.

13. The method of claim 1 wherein said screen is made from a piece of film.

14. The method of claim 13 wherein said film is made of mylar or acetate.

15. The method of claim 13 wherein said film is 0.004 to 0.007 inch mylar film.

16. The method of claim 13 wherein said screen is made using a glass screen having anywhere from 60 to 160 lines per inch.

17. The method of claim 16 wherein the glass screen has approximately 85 lines per inch.

18. The method of claim 16 wherein said vignetting dots are created photographically on one side of said film using the glass screen and said white dots are printed on the other side of said film to create said photoscreen.

19. The method of claim 1 wherein said vignetting dots are created with a line angle of from 0° to 180°.

20. The method of claim 1 wherein said white dots are created with a line angle of from 0° to 180°.

21. The method of claim 1 wherein said white dots and vignetting dots are each created with a line angle of approximately 45° and with the white dots situated between said vignetting dots.

22. The method of claim 1 wherein said vignetting dots have a line angle of approximately 45° and said white dots have a line angle of approximately 105°.

23. A photoscreen for making a halftone reproduction from a document, such as a photograph, having continuous tone areas, in a process where a photograph is placed in a reproducing position relative to a reproducing apparatus and said photoscreen is interposed between the document and reproducing means of the reproducing apparatus so that upon operation of the reproducing apparatus, a halftone reproduction of the document is created, said photoscreen comprising a sheet of transparent substrate material having an array of light modulating, varying density, light gray, vignetting dots formed on one side thereof, which vary in density from a lightest density outer area on the outside perimeter of the dot to a darkest core density in the extreme center of the dot, mixed with an array of light modulating white dots formed on the other side of said sheet of substrate material.

24. The photoscreen of claim 23 wherein said dots occupy 1% to 40% of the total photoscreen space.

25. The photoscreen of claim 23 wherein said vignetting dots occupy 1% to 40% of the total photoscreen space.

26. The photoscreen of claim 25 wherein said vignetting dots occupy 25% to 30% of the total photoscreen space.

27. The photoscreen of claim 25 wherein said vignetting dots occupy approximately 25% of the total photoscreen space.

28. The photoscreen of claim 23 wherein said white dots occupy approximately 1% to 40% of the total photoscreen space.

29. The photoscreen of claim 28 wherein said white dots occupy 25% to 30% of the total photoscreen space.

30. The photoscreen of claim 28 wherein said white dots occupy approximately 25% of the total photoscreen space.

31. The photoscreen of claim 23 wherein said photoscreen is made from a piece of film.

32. The photoscreen of claim 31 wherein said film is made of mylar or acetate.

33. The photoscreen of claim 31 wherein said film is 0.004 to 0.007 inch mylar film.

34. The photoscreen of claim 31 wherein said photoscreen is made using a glass screen having anywhere from 60 to 160 lines per inch.

35. The photoscreen of claim 34 wherein the glass screen has approximately 85 lines per inch.

36. The photoscreen of claim 34 wherein said vignetting dots are created photographically on one side of said film using the glass screen and said white dots are printed on the other side of said film to create said photoscreen.

37. The photoscreen of claim 23 wherein said vignetting dots are created with a line angle of from 0° to 180°.

38. The photoscreen of claim 23 wherein said white dots are created with a line angle of from 0° to 180°.

39. The photoscreen of claim 23 wherein said white dots and vignetting dots are each created with a line angle of approximately 45° and with the white dots situated between the vignetting dots.

40. The photoscreen of claim 23 wherein said vignetting dots have a line angle of approximately 45° and said white dots have a line angle of approximately 105°.

* * * * *